United States Patent
Kim et al.

(10) Patent No.: US 7,132,349 B2
(45) Date of Patent: Nov. 7, 2006

(54) METHODS OF FORMING INTEGRATED CIRCUITS STRUCTURES INCLUDING EPITAXIAL SILICON LAYERS IN ACTIVE REGIONS

(75) Inventors: Sung-min Kim, Incheon Metropolitan (KR); Dong-gun Park, Gyeonggi-do (KR); Chang-sub Lee, Gyeonggi-do (KR); Jeong-dong Choe, Gyeonggi-do (KR); Shin-ae Lee, Gyeonggi-do (KR); Seong-ho Kim, Gyeonggi-do (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 11/334,918

(22) Filed: Jan. 19, 2006

(65) Prior Publication Data

US 2006/0128123 A1 Jun. 15, 2006

Related U.S. Application Data

(62) Division of application No. 10/706,755, filed on Nov. 12, 2003, now Pat. No. 7,015,549.

(30) Foreign Application Priority Data

Nov. 26, 2002 (KR) ............... 10-2002-0073869

(51) Int. Cl.
*H01L 21/20* (2006.01)
*H01L 21/762* (2006.01)

(52) U.S. Cl. ............... 438/425; 438/426; 438/435; 438/478; 438/739

(58) Field of Classification Search ........... 438/425, 438/426
See application file for complete search history.

(56) References Cited

U.S. PATENT DOCUMENTS

| | | | |
|---|---|---|---|
| 4,982,263 A | 1/1991 | Spratt et al. | 257/524 |
| 5,656,845 A | 8/1997 | Akbar | 257/347 |
| 5,963,817 A | 10/1999 | Chu et al. | 438/410 |
| 6,121,659 A | 9/2000 | Christensen et al. | 257/347 |
| 6,174,754 B1 | 1/2001 | Lee et al. | 438/142 |
| 6,429,477 B1 | 8/2002 | Mandelman et al. | 257/301 |
| 6,670,675 B1 | 12/2003 | Ho et al. | 257/347 |
| 6,696,348 B1 * | 2/2004 | Xiang | 438/424 |
| 6,835,981 B1 | 12/2004 | Yamada et al. | 257/347 |
| 2002/0047158 A1 | 4/2002 | Park et al. | 257/347 |
| 2002/0093041 A1 | 7/2002 | Hong | 257/301 |
| 2002/0160574 A1 | 10/2002 | Zahurak et al. | 438/283 |
| 2003/0111681 A1 | 6/2003 | Kawanaka | 257/296 |
| 2003/0213995 A1 | 11/2003 | Duvvury et al. | 257/355 |

\* cited by examiner

*Primary Examiner*—Stephen W. Smoot
(74) *Attorney, Agent, or Firm*—Myers Bigel Sibley & Sajovec, PA

(57) ABSTRACT

An integrated circuit structure can include an isolation structure that electrically isolates an active region of an integrated circuit substrate from adjacent active regions and an insulation layer that extends from the isolation structure to beneath the active region. An epitaxial silicon layer extends from the active region through the insulation layer to a substrate beneath the insulation layer.

13 Claims, 8 Drawing Sheets

METHODS OF FORMING INTEGRATED CIRCUITS STRUCTURES INCLUDING EPITAXIAL SILICON LAYERS IN ACTIVE REGIONS

CLAIM FOR PRIORITY

This application is a divisional application of and claims priority to patent application Ser. No. 10/706,755, filed Nov. 12, 2003, now issued U.S. Pat. No. 7,015,549, which claimed priority to Korean Application No. 10-2002-0073869, filed Nov. 26, 2002, the disclosures of which are hereby incorporated herein by reference in their entireties.

FIELD OF THE INVENTION

The present invention relates to semiconductor structures and methods of forming the same. More particularly, the present invention relates to semiconductor structures having isolation structures and methods of forming the same.

BACKGROUND

As semiconductor devices become highly integrated, issues such as leakage current and punch through may arise. One way of addressing these issues is to use silicon on insulator (SOI) substrate according to conventional technology as illustrated in FIG. 1.

Referring to FIG. 1, a conventional SOI substrate has a structure where an insulation layer 3 and a silicon layer 5 are sequentially stacked on a semiconductor substrate 1. The insulation layer 3 is formed of a thermal oxide and the semiconductor substrate 1 and the silicon layer 5 are formed of a silicon single crystalline. In order to fabricate the SOI substrate, a first silicon substrate 1 having a thermal oxide layer 3 is attached to a second silicon substrate 5, and then a lower part of the second silicon substrate is removed by a planarization process. In a subsequent process, a field oxide layer is formed to contact with the insulation layer 3 in the silicon layer 5 to address the problem of leakage current that may occur during an operation of a transistor. However, the SOI may be expensive since two silicon wafers are used. Additionally, since a transistor is isolated by the insulation layer 3 and a field oxide layer, heat or a hot carrier may not be removed. Furthermore, it may be difficult to apply a back bias.

According to another conventional technology, a path can be formed to provide for the emission of heat or a hot carrier (or for applying a back bias) as illustrated in FIG. 2. Referring to FIG. 2, the silicon layer 5 and the insulation layer 3 in FIG. 1 are sequentially patterned to form an opening partially exposing the semiconductor substrate 1. An epitaxial layer 7 is grown from the exposed semiconductor substrate 1 in the opening to fill the opening. As illustrated in FIG. 2, while the epitaxial layer 7 is grown, a defect (D) may occur at the insulation layer 3, and a void (V) may be formed in the epitaxial layer 7. In the case that the void (V) is very large, the epitaxial layer 7 may not provide an adequate electrical path between the silicon layer 5 and the semiconductor substrate 1. This may result in a reduction in the reliability of the semiconductor substrate.

SUMMARY

Embodiments according to the invention can provide integrated circuit structures that can include an isolation structure that electrically isolates an active region of an integrated circuit substrate from adjacent active regions and an insulation layer that extends from the isolation structure to beneath the active region. An epitaxial silicon layer can extend from the active region through the insulation layer to a substrate beneath the insulation layer.

In some embodiments according to the invention, the insulation layer can include a trench thermal oxide layer on an inner wall of a trench in the substrate. The insulation layer can extend though the inner wall of the trench to beneath the active region.

In some embodiments according to the invention, a nitride liner can be on the trench thermal oxide layer and a field oxide layer in the trench can be on the nitride liner. In some embodiments according to the invention, the nitride liner can extend through the inner wall into the insulation layer beneath the active region.

In some embodiments according to the invention, an impurity-doped region can be at an interface of the substrate and the epitaxial silicon layer. In some embodiments according to the invention, the insulation layer can be a thermal oxide. In some embodiments according to the invention, the active region can be a strained silicon crystalline structure.

In some embodiments according to the invention, the epitaxial silicon layer can be a first epitaxial silicon layer in the active region adjacent to and in contact with the inner wall of the trench. A second epitaxial silicon layer can be in the active region spaced apart from the first epitaxial silicon layer.

In other embodiments according to the invention, an epitaxial silicon layer can be formed from an active region through a silicon layer having a strained crystalline structure to a substrate beneath the silicon layer. Then the silicon layer can be replaced with an insulation layer.

In some embodiments according to the invention, the silicon layer can be a silicon germanium layer. In some embodiments according to the invention, the silicon layer having the strained crystalline structure can be removed the from beneath the active region to form a gap between the active region and the substrate and the insulation layer can be formed in the gap.

In some embodiments according to the invention, the epitaxial silicon layer can be formed from the active region through the silicon layer and another spaced apart silicon layer beneath the silicon layer having a strained crystalline structure to the substrate beneath the second silicon layer. The first and second silicon layers can be replaced with the first insulation layer and a second insulation layer respectively.

DESCRIPTION OF EMBODIMENTS ACCORDING TO THE INVENTION

Figure 1:
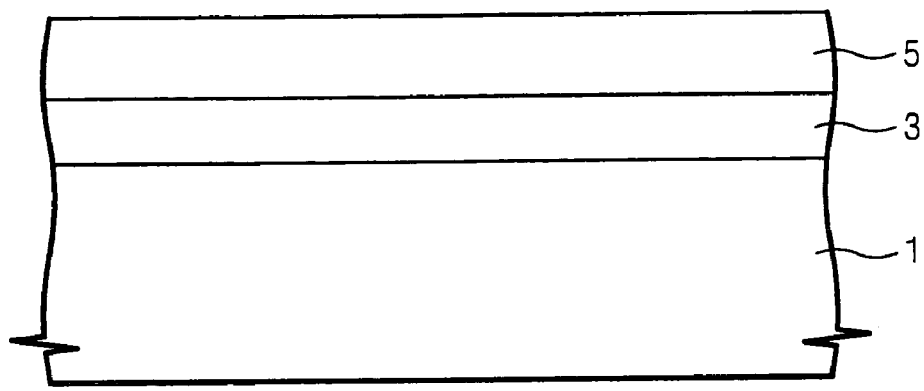
FIG. 1 illustrates a cross-sectional view of a conventional SOI substrate.
Figure 2:
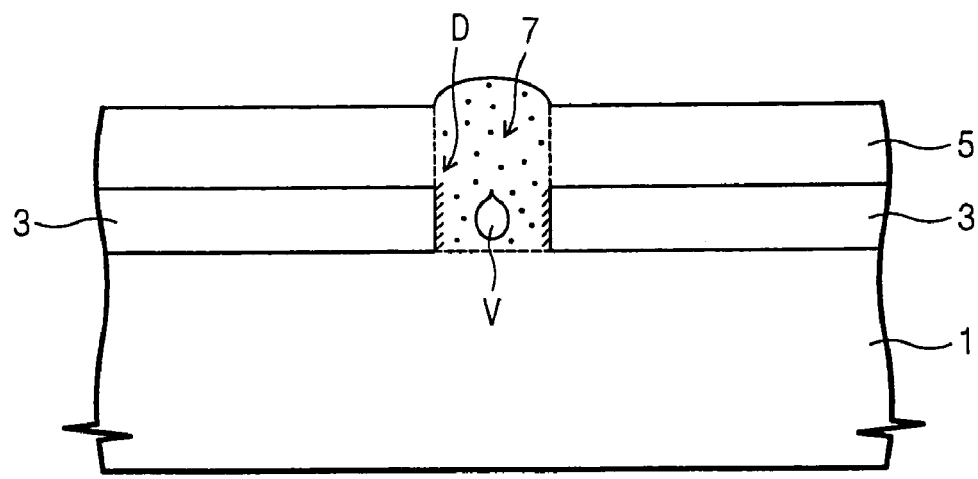
FIG. 2 illustrates a cross-sectional view of an SOI substrate according to a conventional technology.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present.

Furthermore, relative terms, such as "beneath", are used herein to describe one element's relationship to another as illustrated in the Figures. It will be understood that relative terms are intended to encompass different orientations of the device in addition to the orientation depicted in the Figures. For example, if the device in the Figures is turned over, elements described as "beneath" other elements would be oriented "above" the other elements. The exemplary term "beneath", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Figure 3:
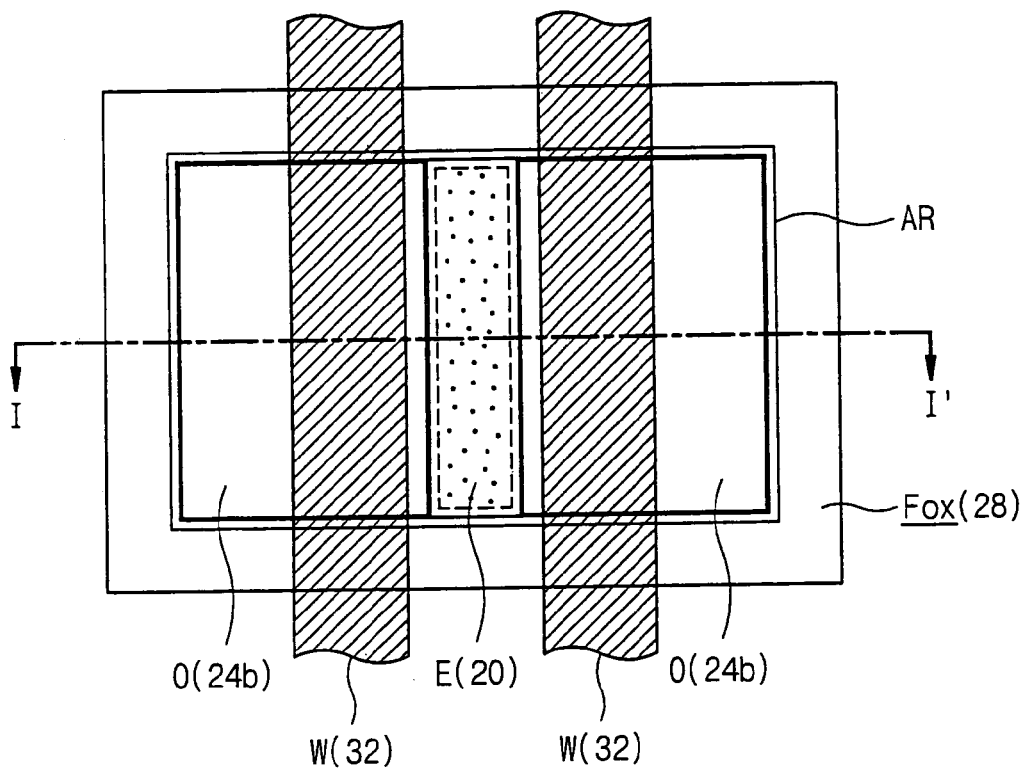
FIG. 3 is a layout view that illustrates embodiments of integrated circuit structures according to the invention.
Figure 4:
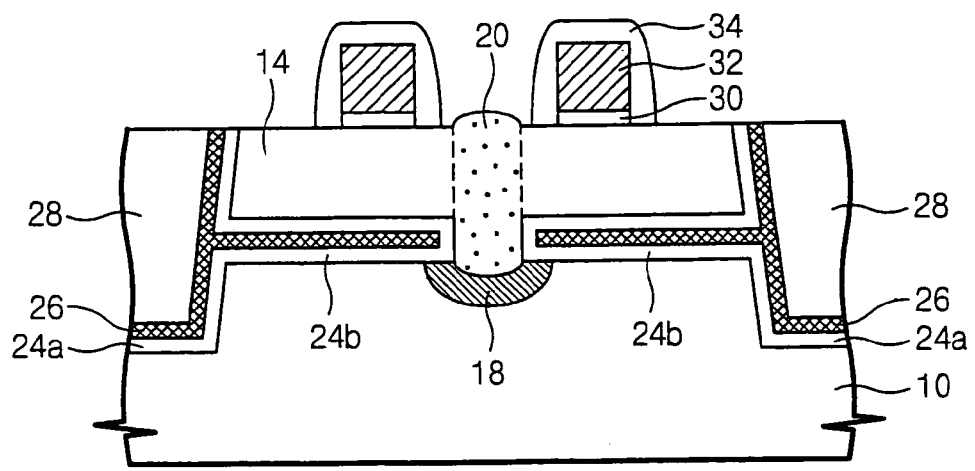
FIG. 4 is a cross-sectional view taken along a I–I' in FIG. 3 that illustrates embodiments of integrated circuit structures according to the invention.

FIG. 3 is a layout view that illustrates embodiments of integrated circuit structures according to the invention. FIG. 4 is a cross-sectional view taken along a I–I' in FIG. 3 that illustrates embodiments of integrated circuit structures according to the invention. Referring to FIGS. 3 and 4, a field oxide layer (Fox) 28 is on an integrated circuit substrate (such as a semiconductor substrate) 10 to define an active region (AR). A silicon layer 14 is on the active region (AR). An insulation layer (O) 24b is beneath the silicon layer 14 between the silicon layer 14 and the substrate 10. Word lines (W) 32 cross over the active region (AR). A gate oxide layer 30 is between the word line (W) 32 and the silicon layer 14. A capping layer pattern 34 covers the word line (W) 32. An epitaxial layer 20 is extends from the silicon layer 14 through the insulation layer 24b to the substrate 10 between the world lines (W) 32. An impurity-doped region 18 is between the epitaxial layer 20 and the substrate 10. A trench thermal oxide layer 24a is in a trench (in the substrate 10) between the field oxide layer (Fox) 28 and the substrate 10 and between the field oxide layer (Fox) 28 and the silicon layer 14. A nitride liner 26 is between the trench thermal oxide layer 24a and the field oxide layer 28. In some embodiments according to the invention, the nitride liner 26 can be extended into the insulation layer 24b to beneath the active layer 14 as shown in FIG. 4.

FIGS. 5A through 5E are cross-sectional views that illustrate embodiments of methods of forming integrated circuit structures according to the invention. FIG. 5F is a cross-sectional view that illustrates embodiments of integrated circuit structures according to the invention.

Figure 5A:
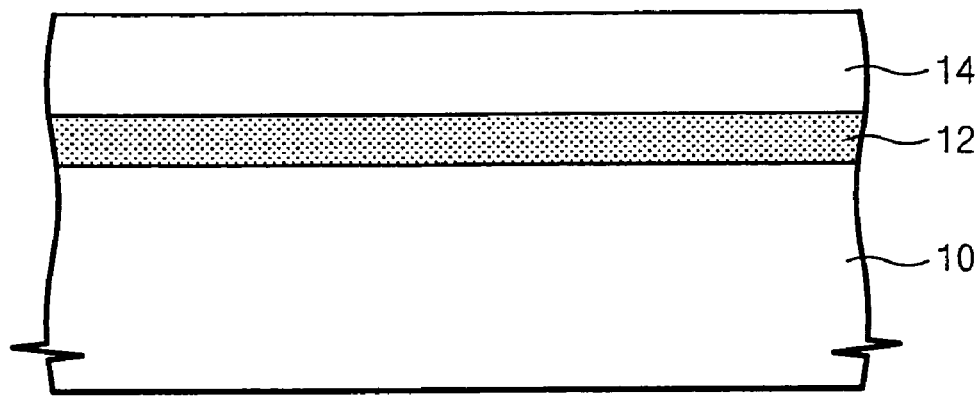
FIGS. 5A through 5E are cross-sectional views that illustrate embodiments of methods of forming integrated circuit structures according to the invention.

Referring to FIG. 5A, a sacrificial layer 12 and a silicon layer 14 are sequentially formed on a substrate 10. The sacrificial layer 12 may be formed of silicon germanium (SiGe). A silicon germanium layer may be deposited on the substrate 10 (having a silicon single crystalline structure). Since germanium has a larger atom size than silicon, the size of the lattice of the silicon germanium layer may be made to be greater than a silicon single crystalline by increasing the germanium concentration in the SiGe. Accordingly, when the silicon layer 14 is grown on the silicon germanium layer, the lattice of the silicon layer 14 may be broader than a lattice associated with a silicon single crystalline structure, thereby allowing a transistor formed in the active area to have increased speed due to the strained lattice structure.

Figure 5B:
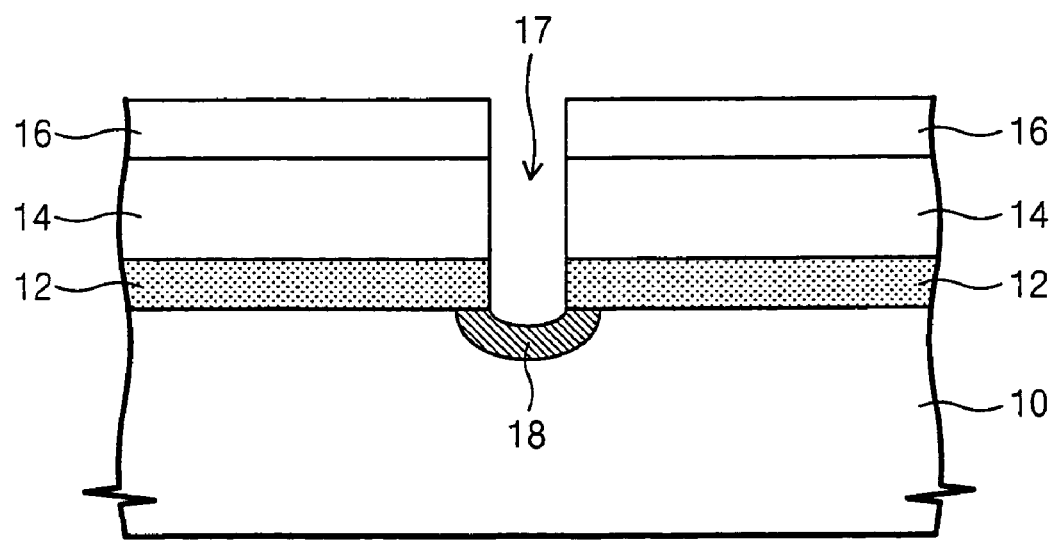

Referring to FIG. 5B, a mask pattern 16 is formed on the silicon layer 14. The mask pattern 16 can be formed of silicon nitride. The silicon layer 14 and the sacrificial layer 12 are sequentially patterned using the mask pattern 16, thereby forming an opening 17 that exposes the substrate 10. The opening 17 may have a width that is greater than a depth of the opening 17. An impurity-doped region 18 is formed in the substrate 10 that is exposed by the opening 17 using the mask pattern 16.

Figure 5C:
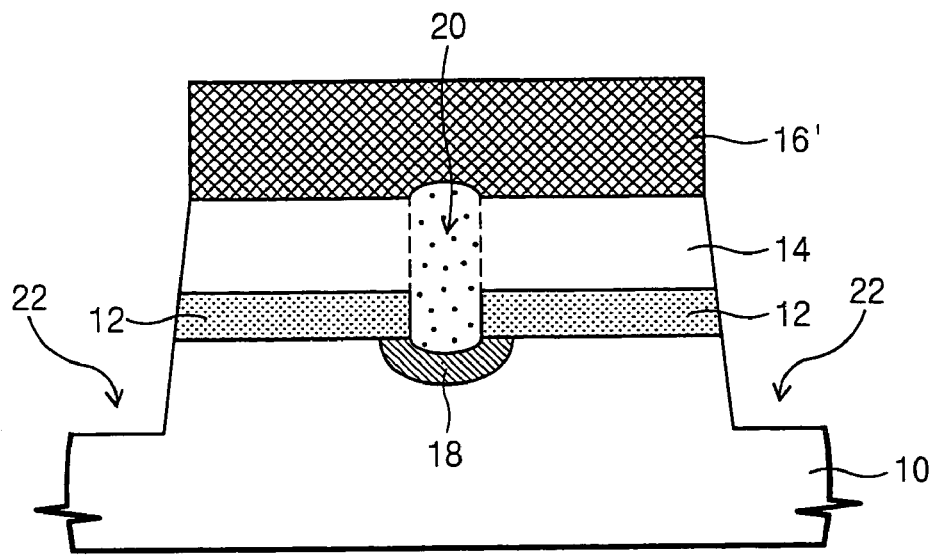

Referring to FIG. 5C, an epitaxial layer 20 is grown from the substrate 10 exposed by the opening 17, thereby filling the opening 17. A silicon nitride layer is formed on the mask pattern 16 to cover the epitaxial layer 20. The silicon nitride layer and the mask pattern 16 are patterned to form a new mask pattern 16' which can be used to form a field oxide layer. The silicon layer 14, the sacrificial layer 12 and a portion of the substrate 10 are etched using the new mask pattern 16', thereby forming a trench 22.

Figure 5D:
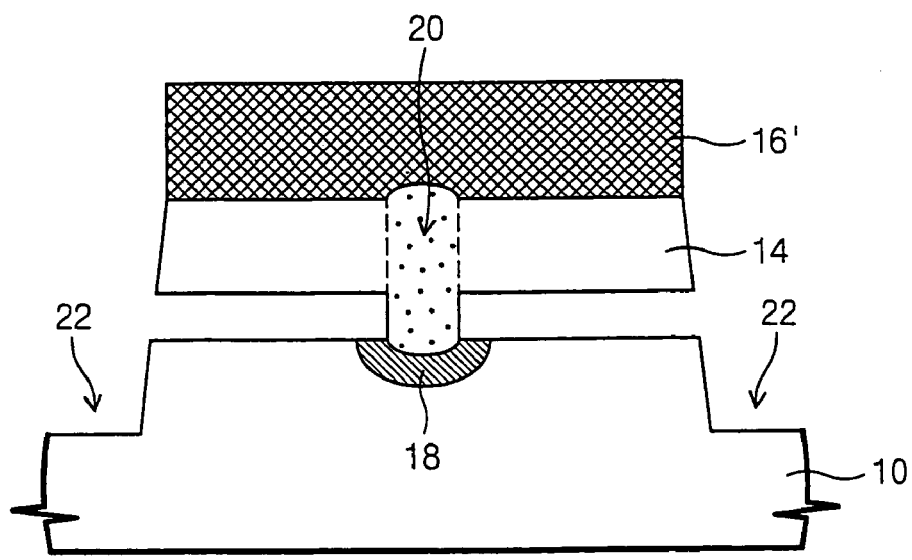

Referring to FIG. 5D, the sacrificial layer 10 exposed by the trench is removed, thereby forming a gap between the silicon layer 14 and the substrate 10. In particular, the gap exposes a bottom surface of the silicon layer 14, a side wall of the epitaxial layer 20 and a top surface of the substrate 10. The etching process used to remove the sacrificial layer 12 may use a dry etch by supplying plasma of one or more of the following gases: hydrogen ($H_2$), oxygen ($O_2$), nitrogen ($N_2$) and fluoric compounds such as $NF_3$ and $CF_4$, without applying a bias in a dry etch chamber. The etch process used to remove the sacrificial layer 12 may employ a wet etch using one or more of the following solutions: ammonia water ($NH_4OH$), hydrogen peroxide ($H_2O_2$), deionized water ($H_2O$), nitric acid ($HNO_3$) and fluoric acid (HF).

Figure 5E:
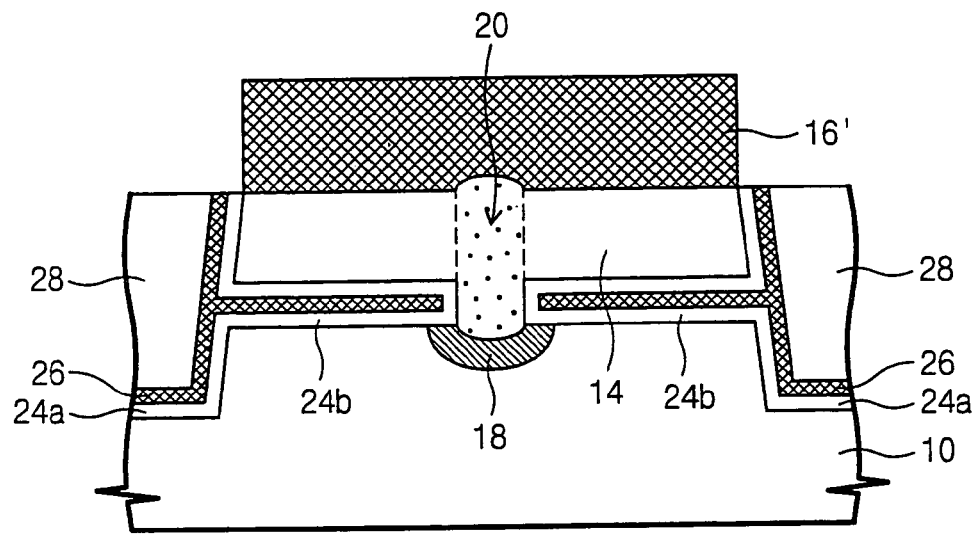
Figure 5F:
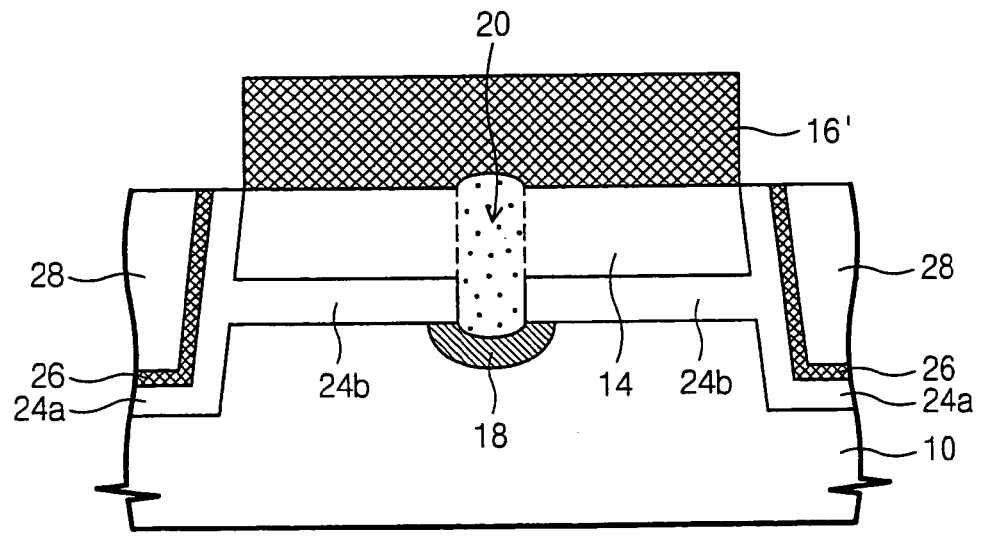
FIG. 5F is a cross-sectional view that illustrates embodiments of integrated circuit structures according to the invention.

Referring to FIGS. 5E and 5F, the exposed substrate 10 (where the sacrificial layer 12 has been removed) is thermally oxidized, thereby forming a trench thermal oxide layer 24a on an inner wall of the trench 22 and on the bottom of the trench 22. An insulation layer 24b is also formed by the thermal oxidation in the gap formed by removing the sacrificial layer 12. In some embodiments according to the invention, the insulation layer 24b may fill the gap where the sacrificial layer is removed. A nitride liner 26 is conformally deposited on the surface of the substrate 10. In some embodiments according to the invention, if the insulation layer 24b does not completely fill the gap, the nitride liner 26 may be formed on the insulation layer 24b beneath the active region 14.

In a subsequent process, the mask pattern 16' is removed, and a gate pattern including a gate oxide layer 30 and a word line 32 is formed on the silicon layer 14 as described in reference to FIG. 4. A capping layer pattern 34 is formed to cover the gate pattern.

Although not illustrated in Figures, impurities are implanted into the silicon layer 14 and the epitaxial layer 20 using the capping layer pattern 34 as an ion-implantation mask, thereby forming source/drain regions.

According to embodiments of the invention, the source/drain regions are connected to the insulation layer 24b, thereby allowing a reduction in capacitance therebetween. Also, the transistor may operate faster due to the strained silicon single crystalline structure of the silicon layer 14. The insulation layer 24b and the field oxide layer 28 can promote the electrical isolation of the transistor, thereby reducing leakage current. The epitaxial layer 20 can provide a path for heat or application of a back bias. Additionally, forming the epitaxial layer 20 before the insulation layer 24b may reduce defects and help reduce voids.

Figure 6:
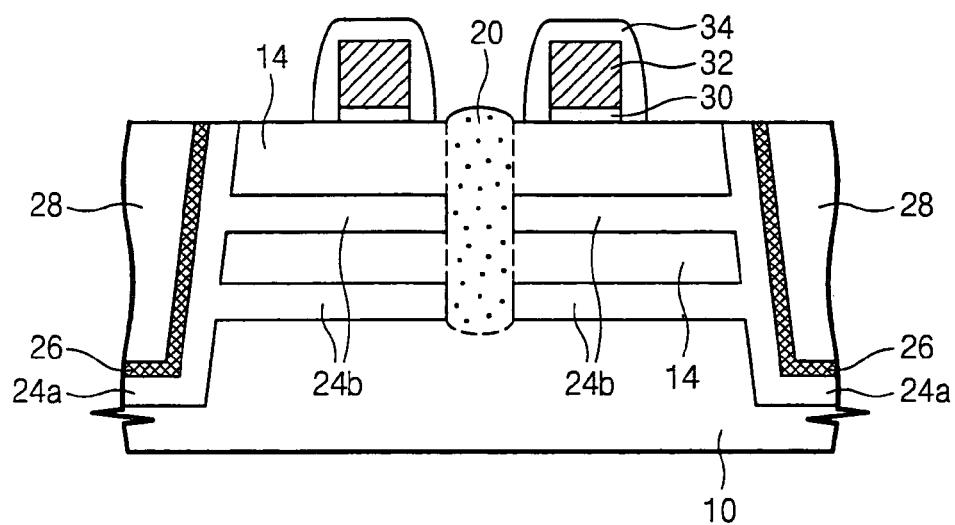
FIG. 6 is a cross-sectional view taken along a I–I' in FIG. 3 that illustrates embodiments of integrated circuit structures according to the invention.

FIG. 6 is a cross-sectional view taken along a I–I' in FIG. 3 that illustrates embodiments of integrated circuit structures according to the invention. Referring to FIG. 6, an integrated circuit device includes two pairs of a silicon layers 14 (one pair on each side of the epitaxial layer) and two pairs of insulation layers 24b (one pair on each side of the epitaxial layer). The sacrificial layer 12 and the silicon layer 14 may be alternatively stacked on the substrate 10. Other elements can be as described above in reference to FIGS. 3–5. The two insulation layers 24b may reduce leakage current and increase the speed of the transistor. It will be understood that the nitride liner 26 can be included in the gap between the active region and the substrate as a part of the insulation layer 24b.

Figure 7:
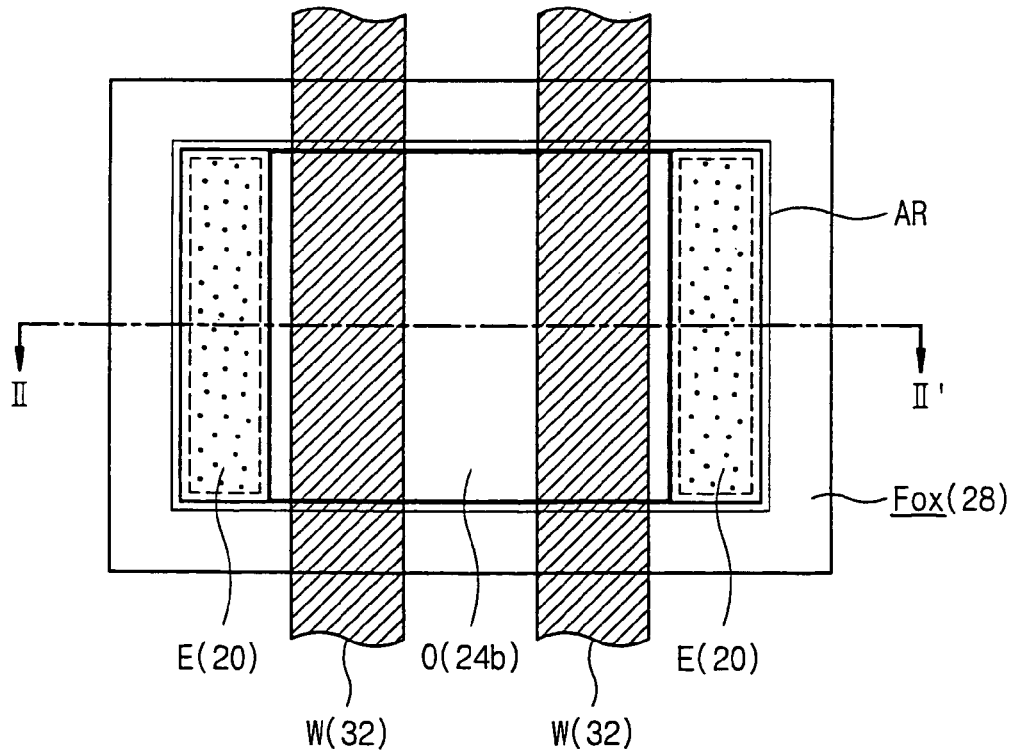
FIG. 7 is a layout view that illustrates embodiments of integrated circuit structures according to the invention.
Figure 8:
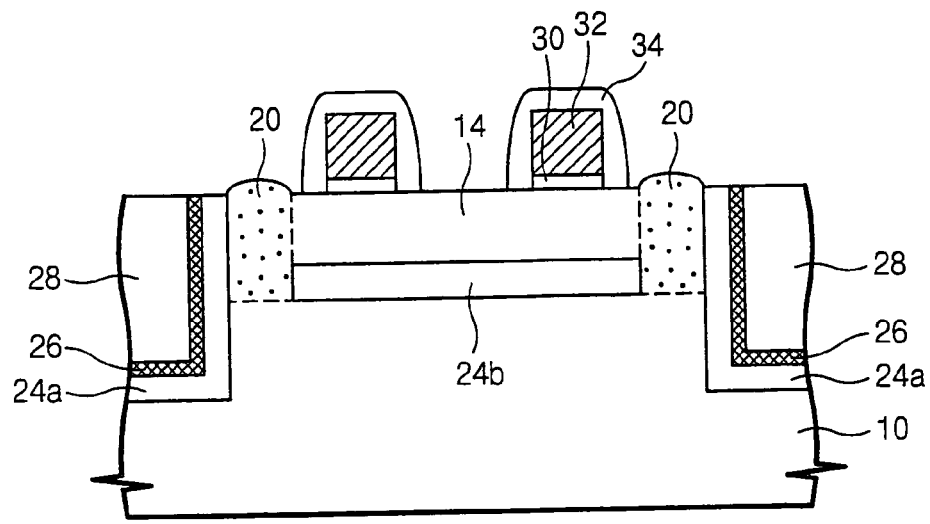
FIG. 8 is a cross-sectional view taken along a II–II' in FIG. 7 that illustrates embodiments of integrated circuit structures according to the invention.

FIG. 7 is a layout view that illustrates embodiments of integrated circuit structures according to the invention. FIG. 8 is a cross-sectional view taken along a II–II' in FIG. 7 that illustrates embodiments of integrated circuit structures according to the invention.

Referring to FIGS. 7 and 8, an epitaxial layer (E) 20 is between the field oxide layer (Fox) 28 and the word line (W) 32. An insulation layer 24b is between the silicon layer 14 and a substrate 10 and connected to a trench thermal oxide layer 24a. In some embodiments according to the invention, integrated circuit devices can be formed using methods discussed above in reference to FIGS. 1–5, however, a patterned region of the sacrificial layer 12 and the silicon layer 14 may be different than that shown in FIG. 5A. It will be understood that the nitride liner 26 can be included in the gap between the active region and the substrate as part of the insulation layer 24b.

Figure 9:
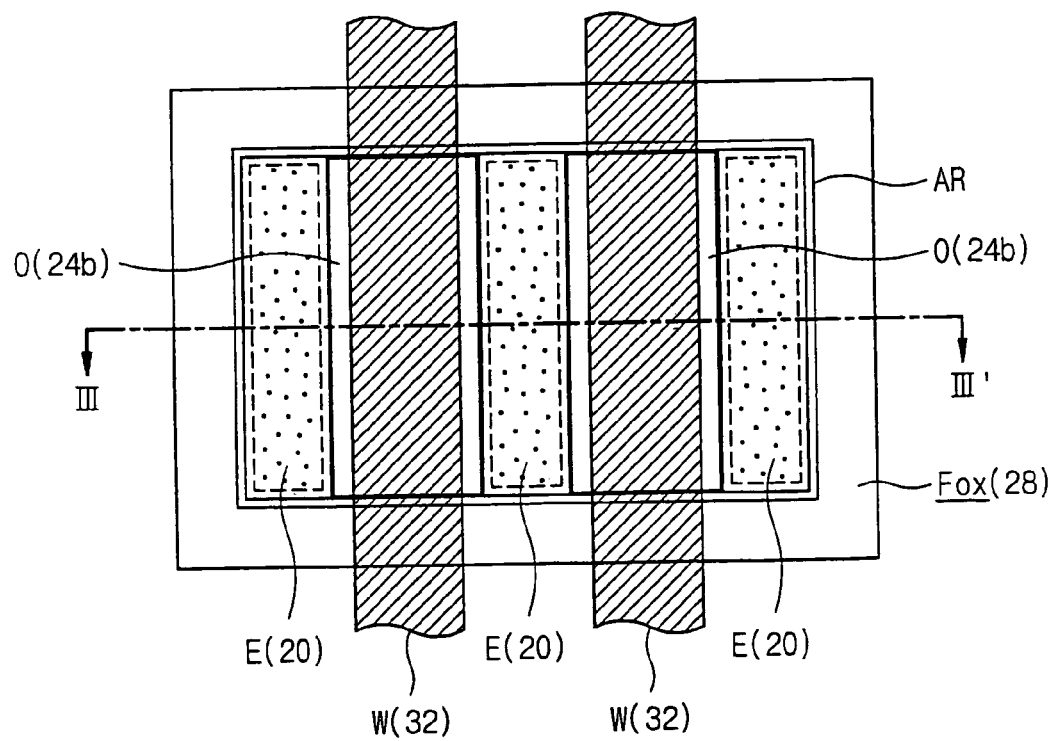
FIG. 9 is a layout view that illustrates embodiments of integrated circuit structures according to the invention.
Figure 10:
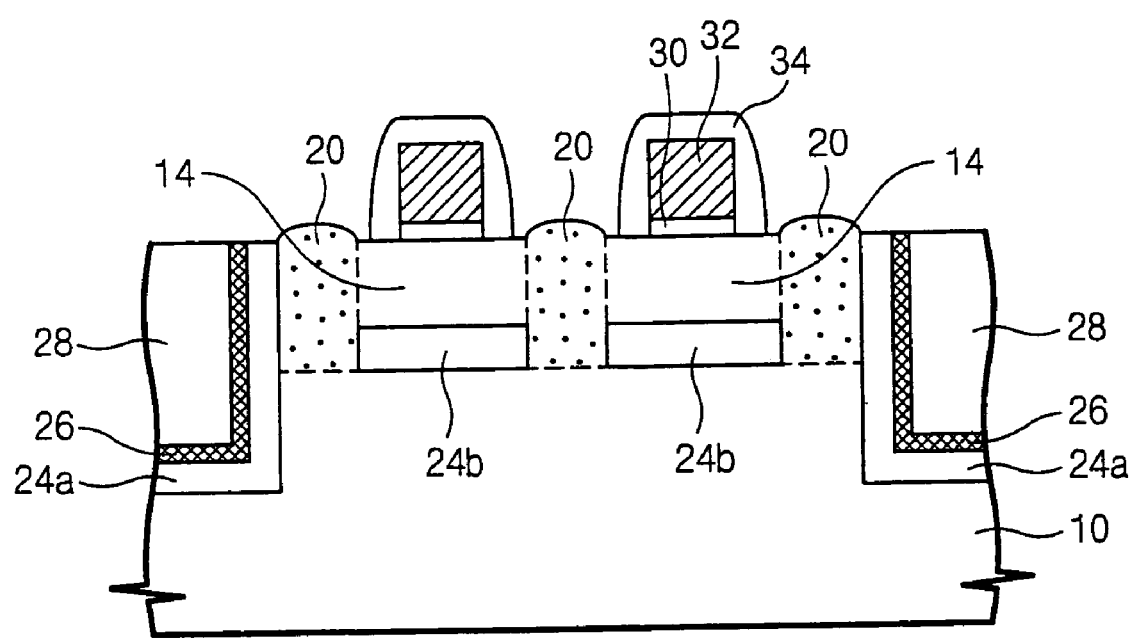
FIG. 10 is a cross-sectional view taken along a III–III' in FIG. 9 that illustrates embodiments of integrated circuit structures according to the invention.

FIG. 9 is a layout view that illustrates embodiments of integrated circuit structures according to the invention. FIG. 10 is a cross-sectional view taken along a III–III' in FIG. 9 that illustrates embodiments of integrated circuit structures according to the invention.

Referring to FIGS. 9 and 10, an epitaxial layer (E) 20 is on both sides of the word line (W) 32. The insulation layer 24b is between the substrate 10 and the silicon layer 14, and connected to the trench thermal oxide 24a beneath and along the word line (W) 32. In some embodiments according to the invention, integrated circuit devices can be formed using methods discussed above in reference to FIGS. 1–5, however, a patterned region of the sacrificial layer 12 and the silicon layer 14 is different than that shown in FIG. 5A. It will be understood that the nitride liner 26 can be included in the gap between the active region and the substrate as part of the insulation layer 24b.

According to embodiments of the invention, the source/drain regions are electrically connected to the insulation layer, thereby allowing a reduction in capacitance therebetween. Also, the transistor may operate faster due to the strained silicon single crystalline structure of the silicon layer. The insulation layer and the field oxide layer can promote the electrical isolation of the transistor, thereby reducing leakage current. The epitaxial layer can provide an path for heat or application of a back bias. Additionally, forming the epitaxial layer before the insulation layer may reduce defects and help reduce voids.

Many alterations and modifications may be made by those having ordinary skill in the art, given the benefit of present disclosure, without departing from the spirit and scope of the invention. Therefore, it will be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming an integrated circuit structure comprising:
    forming an epitaxial silicon layer from an active region through a silicon layer having a strained crystalline structure to a substrate beneath the silicon layer; and then
    replacing the silicon layer with an insulation layer.

2. A method according to claim 1 wherein the silicon layer comprises a silicon germanium layer.

3. A method according to claim 1 wherein the step of replacing comprises:
    removing the silicon layer having the strained crystalline structure from beneath the active region to form a gap between the active region and the substrate; and
    forming the insulation layer in the gap.

4. A method according to claim 3 wherein the step of forming the insulation layer in the gap further comprises:
    forming an isolation structure that electrically isolates the active region from adjacent active regions, wherein the isolation structure includes an inner wall that contacts the active region.

5. A method according to claim 4 wherein step of forming the epitaxial silicon layer further comprises:
    forming first and second spaced apart epitaxial silicon layers from the active region through the silicon layer to the substrate beneath the silicon layer, wherein the first epitaxial silicon layer contacts the inner wall and the second epitaxial silicon layer is spaced apart from the inner wall.

6. A method according to claim 1 wherein the silicon layer comprises a first silicon layer and the insulation layer comprises a first insulation layer, wherein the step of forming further comprises:

forming the epitaxial silicon layer from the active region through the first silicon layer and a spaced apart second silicon layer beneath the first silicon layer having a strained crystalline structure to the substrate beneath the second silicon layer; and the step of replacing comprises replacing the first and second silicon layers with the first insulation layer and a second insulation layer respectively.

7. A method of forming an integrated circuit structure comprising:

forming a silicon layer having a strained crystalline structure beneath an active region of an integrated circuit;

forming an epitaxial silicon layer from the active region through the silicon layer to a substrate beneath the silicon layer;

removing the silicon layer from between the active region and the substrate to form a gap; and forming an insulating layer in the gap.

8. A method of forming a semiconductor device, comprising:

sequentially forming at least one pair of a sacrificial layer and a silicon layer on a semiconductor substrate;

forming an opening exposing the semiconductor substrate by sequentially patterning a predetermined region of at least one pair of the sacrificial layer and the silicon layer;

selectively growing an epitaxial layer from the exposed semiconductor substrate in the opening, thereby filling the opening;

forming a trench for forming a field oxide layer by sequentially patterning at least one pair of the sacrificial layer and the silicon layer and an upper part of the semiconductor substrate;

removing the sacrificial layer;

forming a trench thermal oxide layer at an inner wall and a bottom of the trench and simultaneously forming an insulation layer along a region where the sacrificial layer is removed, by thermally oxidizing the semiconductor substrate;

forming a nitride liner on the trench oxide layer; and filling the trench by stacking a field oxide layer on the nitride liner.

9. The method as claimed in claim 8, wherein the insulation layer is conformally formed along a region where the sacrificial layer is removed, and the nitride liner is simultaneously formed on a surface of the insulation layer when the nitride liner is formed on the trench thermal oxide layer.

10. The method as claimed in claim 8, wherein the sacrificial layer is formed of silicon germanium (SiGe).

11. The method as claimed in claim 8, wherein the removing of the sacrificial layer is performed by using plasma of at least one gas selected from a group consisting of hydrogen ($H_2$), oxygen ($O_2$), nitrogen ($N_2$) and fluoric compounds such as $NF_3$ and $CF_4$.

12. The method as claimed in claim 8, wherein the removing of the sacrificial layer is performed by using at least one solution selected from a group consisting of ammonia water ($NH_4OH$), hydrogen peroxide ($H_2O_2$), deionized water ($H_2O$), nitric acid ($HNO_3$) and fluoric acid (HF).

13. The method as claimed in claim 8, wherein forming the opening is followed by implanting impurities into the semiconductor substrate beneath the opening to form an impurity-doped region.

* * * * *